United States Patent [19]

Misawa

[11] Patent Number: 5,077,493
[45] Date of Patent: Dec. 31, 1991

[54] WIRED LOGIC CIRCUIT FOR USE IN GATE ARRAY INTEGRATED CIRCUIT

[75] Inventor: Hiroyuki Misawa, Tokyo, Japan
[73] Assignee: NEC Corporation, Tokyo, Japan
[21] Appl. No.: 618,841
[22] Filed: Nov. 28, 1990
[30] Foreign Application Priority Data Nov. 28, 1989 [JP] Japan .................................. 1-310118

[51] Int. Cl.[5] .......................................... H03K 19/177
[52] U.S. Cl. .................................... 307/455; 307/466; 307/467; 307/356; 307/357
[58] Field of Search ................ 307/455, 466, 467, 356, 307/357

[56] References Cited

U.S. PATENT DOCUMENTS

| 3,648,061 | 3/1972 | Black et al. | 307/455 |
| 4,311,926 | 1/1982 | Patel et al. | 307/466 |
| 4,999,520 | 3/1991 | Usami et al. | 307/456 |

Primary Examiner—Stanley D. Miller
Assistant Examiner—Scott A. Ouellette
Attorney, Agent, or Firm—Sughrue, Mion, Zinn Macpeak & Seas

[57] ABSTRACT

A gate array integrated circuit includes four internal logic circuits each composed of a current mode logic circuit and an emitter follower circuit having an input connected to an output of the current mode logic circuit. One wired logic circuit is formed by interconnecting output terminals of four emitter follower circuits. An one end of an interconnection wiring conductor for interconnecting the output terminals of the four emitter follower circuits is connected to an output terminal of a first emitter follower circuit, and the other end of the interconnection wiring conductor is connected to an output terminal of fourth emitter follower circuit of the N emitter follower circuits. The interconnection wiring conductor serially extends and traces all the output terminals of the four emitter follower circuits from the output terminal of the first emitter follower circuit to the output terminal of the fourth emitter follower circuit without branch, so that the output terminals of the second and third emitter follower circuits are connected to an intermediate portion of the interconnection wiring conductor in the order. A pair of resistors or constant current sources having the same value are connected to only the output terminals of the first and fourth emitter follower circuits, respectively.

3 Claims, 3 Drawing Sheets

WIRED LOGIC CIRCUIT FOR USE IN GATE ARRAY INTEGRATED CIRCUIT

BACKGROUND OF THE INVENTION

1. Field of the Invention

The present invention relates to a gate array integrated circuit, and more specifically an ECL (emitter coupled logic) gate array integrated circuit including a plurality of internal logic circuit outputs each constituted of an emitter follower circuit output, and a wired logic circuit formed by interconnecting respective emitter follower circuit output terminals.

2. Description of related art

A wired logic has been used in ECL circuits for a long time. For example, a logic sum can be easily obtained by only interconnecting output terminals of emitter follower circuits each constituting an output of a logic circuit. Therefore, the wired logic has become one important means for forming a logic circuit in the ECL gate array integrated circuit (simply called "ECL gate array" hereinafter).

In the prior art, when a wired logic is formed in the ECL gate array, output terminals of a plurality of emitter followers respectively constituting a corresponding number of logic circuit outputs are interconnected by a wiring conductor arbitrarily located among the emitter follower output terminals, and a termination resistor or a constant current source is connected to each of all the emitter follower output terminals, or to only one of the emitter follower output terminals.

In an emitter follower circuit having an emitter connected through a termination resistor to a low level or ground, when the emitter follower circuit outputs a high level potential (H), an emitter follower circuit current flows, which is greatly larger than that flowing when the emitter follower circuit outputs a low level potential (L).

Therefore, in the case that a wired logic is formed by interconnecting among a plurality of emitter follower output terminals by means of a wiring conductor, the emitter follower circuit current flows through the interconnection wiring conductor. However, the interconnection wiring conductor has been distributed or patterned in the shape of a tree structure having a trunk and a plurality of branches divided from the trunk, and if necessary, a plurality of twigs divided from the branches. Each of the emitter follower output terminals is connected to a tip end of a corresponding branch (or twig if exists) of the interconnection wiring conductor.

Here, consider a wired logic circuit formed by interconnecting emitters of four emitter follower transistors (Qa, Qb, Qc and Qd) by an interconnection wiring conductor patterned in the shape of a tree structure having one trunk and a pair of branches divided from each end of the trunk (four branches in total), the respective emitters of each emitter follower transistors being connected to a termination low potential through termination resistors Ra, Rb, Rc and Rd having the same resistance, respectively, and a collector of each emitter follower transistor being connected to a high potential. Assuming that the emitter follower current of 2 mA flows in total, a current of 0.5 mA will flow through each termination resistor.

If all of the four emitter follower transistors are turned on, the emitter follower current flowing through each of the turned-on transistors will flow through the termination resistor directly connected to the emitter of the turn-on transistor, and therefore, no current flows through the interconnection wiring conductor patterned in the shape of a tree structure. However, if only one of the four emitter follower transistors, for example Qa is turned on, the emitter follower current flowing through the only turned-on transistor Qa will flow not only to the termination resistor Ra directly connected to the turned-on transistor Qa but also to the termination resistors Rb, Rc and Rd associated to the other transistors Qb, Qc and Qd. Namely, the emitter follower current flowing from the only turned-on transistor Qa to the termination resistors Rb, Rc and Rd is distributed through the interconnection wiring conductor patterned in the shape of a tree structure.

Specifically, a current of 0.5 mA flows from the emitter of the only turned-on transistor Qa directly through the termination resistor Ra connected to the turned-on transistor Qa, and the remaining current of 1.5 mA flows from the only turned-on transistor Qa through the branch of the interconnection wiring conductor extending from the only turned-on transistor Qa to one end of the trunk of the interconnection wiring conductor. In addition, a current of 1.0 mA flows through the trunk of the interconnection wiring conductor, and a current of 0.5 mA flows through each of the remaining three branches.

Therefore, a current of 1.5 mA flows at maximum through the interconnection wiring conductor. This prior art wired logic will be called a "first prior art wired logic" in this specification.

Here, consider a modification of the above mentioned first prior art wired logic, in which the emitter of only one of the four emitter follower transistors (Qa) is connected to the termination low potential through the termination resistor (Ra), but the emitters of the other emitter follower transistors (Qb, Qc and Qd) are not provided with a termination resistor. In other words, the only termination resistor Ra is connected to the interconnection wiring conductor constituting the wired logic.

In this case, if the emitter follower transistors Qa connected directly to the only termination resistor Ra is turned on, the emitter follower current of 2 mA will flow from the turned-on transistor Qa directly through the only termination resistor Ra, and therefore, no current flows through the interconnection wiring conductor patterned in the shape of a tree structure. However, if one of the emitter follower transistors Qa, Qc and Qd, which are not provided with a termination resistor, is turned on, the emitter follower current of 2 mA will flow from the turned-on transistor to the only termination resistor Ra (directly connected to the emitter of the transistor Qa) through a portion of the interconnection wiring conductor extending between an emitter of the turned-on transistor and the only termination resistor Ra. But, through the other portion of the interconnection wiring conductor, no current flows.

Therefore, a current of 2 mA flows at maximum through the interconnection wiring conductor. This prior art wired logic will be called a "second prior art wired logic" in this specification.

On the other hand, the ECL gate array having output circuits formed of the emitter followers is required to operate at a high speed. Therefore, an impedance of the termination resistor is required to be as small as possible. However, if the impedance of the termination resistor is made small, the emitter follower circuit current will inevitably become large. This can be also applied in the wired logic.

As seen from the above, the wired logic in the emitter follower circuits of the conventional gate array integrated circuits has been constituted by interconnecting N emitter follower output terminals by means of an interconnection wiring conductor patterned in an arbitrary connection pattern such as a tree structure. For example, if the circuit is configured so as to cause an emitter follower circuit current of 2 mA to flow, a current of $\{2\times(N-1)/N\}$ mA will flows at maximum through the interconnection wiring conductor constituting the wired logic in the case that each of all the emitter follower output terminals is provided with one termination resistor. In the case that only one of the emitter follower output terminals mutually connected by the interconnection wiring conductor is provided with one termination resistor, a current of 2 mA will flows at maximum through the interconnection wiring conductor constituting the wired logic.

In the ECL gate array, on the other hand, since the interconnection wiring conductor constituting the wired logic is automatically located by means of CAD technique, the interconnection wiring conductors have a uniform width, but different lengths.

In the ECL gate array having the above mentioned restriction, the fact that a large current is caused to flow through the interconnection wiring conductor constituting the wired logic, has the following two disadvantages:

First, since the interconnection wiring conductor itself has a resistance, a voltage shift will occur, which corresponds to a product of the resistance and a current flowing through the interconnection wiring conductor. As a result, a noise margin in the ECL logic circuit is reduced.

For example, if a current of 2 mA flows through the wiring conductor having a wiring resistance of 50Ω, a potential shift of 100 mV will occur.

Secondly, the fact that a large current flows through the wiring conductor having a uniform width, means that an electric current density is high, and therefore, a margin for stress migration is reduced.

Under the above mentioned two disadvantages, the conventional ECL gate array has been constructed to comprise a wired logic formed of an aluminum wiring conductor having a width on the order of 6 μm and a thickness on the order of 1 μm. Accordingly, the wiring resistance of the wiring conductor is about 5Ω per one millimeter (mm). Therefore, when an emitter follower current of 2 mA is caused to flow, a current density of the wiring conductor becomes $0.33\times10^5$ A/cm² in a wired logic arrangement in which only one emitter follower output terminal is connected with a termination resistor. In this case, a magnitude of a potential shift caused by the wiring conductor resistance is within an extent controllable in design of devices.

However, the ECL gate array is recently becoming a large scale more and more, and at the same time, the degree of fineness or microminiaturization is being advanced more and more. As a result, a width of a recent wiring conductor is on the order of 2 μm.

On the other hand, although the microminiaturization of wiring conductors and elements has been advanced, a demand for a high speed operation in the ECL gate array continues or is maintained, and therefore, it is not allowed to reduce the emitter follower circuit current in proportion to the microminiaturization of wiring conductors.

For example, if a wired logic is constructed so as to cause an emitter follower circuit current to flow through a wiring conductor having a width of 2 μm, the wiring resistance becomes about 15 Ω/mm, assuming that the material and the thickness of the wiring conductor do not change. Therefore, the current density of the wiring conductor becomes $1\times10^5$ A/cm². Namely, this is a triple of the current density in the wiring conductor having the width of 6 μm.

Considering the stress migration, this would result in deteriorated reliability of the ECL gate array. In addition, if the voltage shift in the wiring conductor is limited below a certain constant value, difficulty in design is increased.

SUMMARY OF THE INVENTION

Accordingly, it is an object of the present invention to provide a gate array integrated circuit which has overcome the above mentioned defect of the conventional one.

Another object of the present invention is to provide a gate array integrated circuit which has a high integrated density and which can operate at a high speed.

Still another object of the present invention is to provide a wired logic composed of emitter follower output circuits in a gate array integrated circuit, in which a maximum current density of a current flowing through an interconnection wiring conductor constituting the wired logic can be maintained at a low level even if a relatively narrow or thin wiring conductor is used.

The above and other objects of the present invention are achieved in accordance with the present invention by a gate array integrated circuit including a plurality of internal logic circuits each composed of a logic circuit and an emitter follower circuit having an input connected to an output of the logic circuit, and at least one wired logic circuit formed by interconnecting output terminals of N emitter follower circuits included in the plurality of internal logic circuits, where N is integer greater than 2, wherein one end of an interconnection wiring conductor for interconnecting the output terminals of the N emitter follower circuits is connected to an output terminal of a first emitter follower circuit of the N emitter follower circuits, and the other end of the interconnection wiring conductor is connected to an output terminal of an Nth emitter follower circuit of the N emitter follower circuits, the interconnection wiring conductor extending from the output terminal of the first emitter follower circuit to the output terminal of the Nth emitter follower circuit to serially trace all the output terminals of the N emitter follower circuits without branch, so that the output terminals of the N emitter follower circuits excluding the output terminals of the first and Nth emitter follower circuits are connected to an intermediate portion of the interconnection wiring conductor in the order, only the output terminals of the first and Nth emitter follower circuits being connected with load means having the same value, respectively.

In a preferred embodiment, both of the load means can be composed of a pair of resistors having the same resistance, or a pair of constant current sources having the same current capacity.

The above and other objects, features and advantages of the present invention will be apparent from the following description of preferred embodiments of the invention with reference to the accompanying drawings.

DESCRIPTION OF THE PREFERRED EMBODIMENTS

Figure 1:
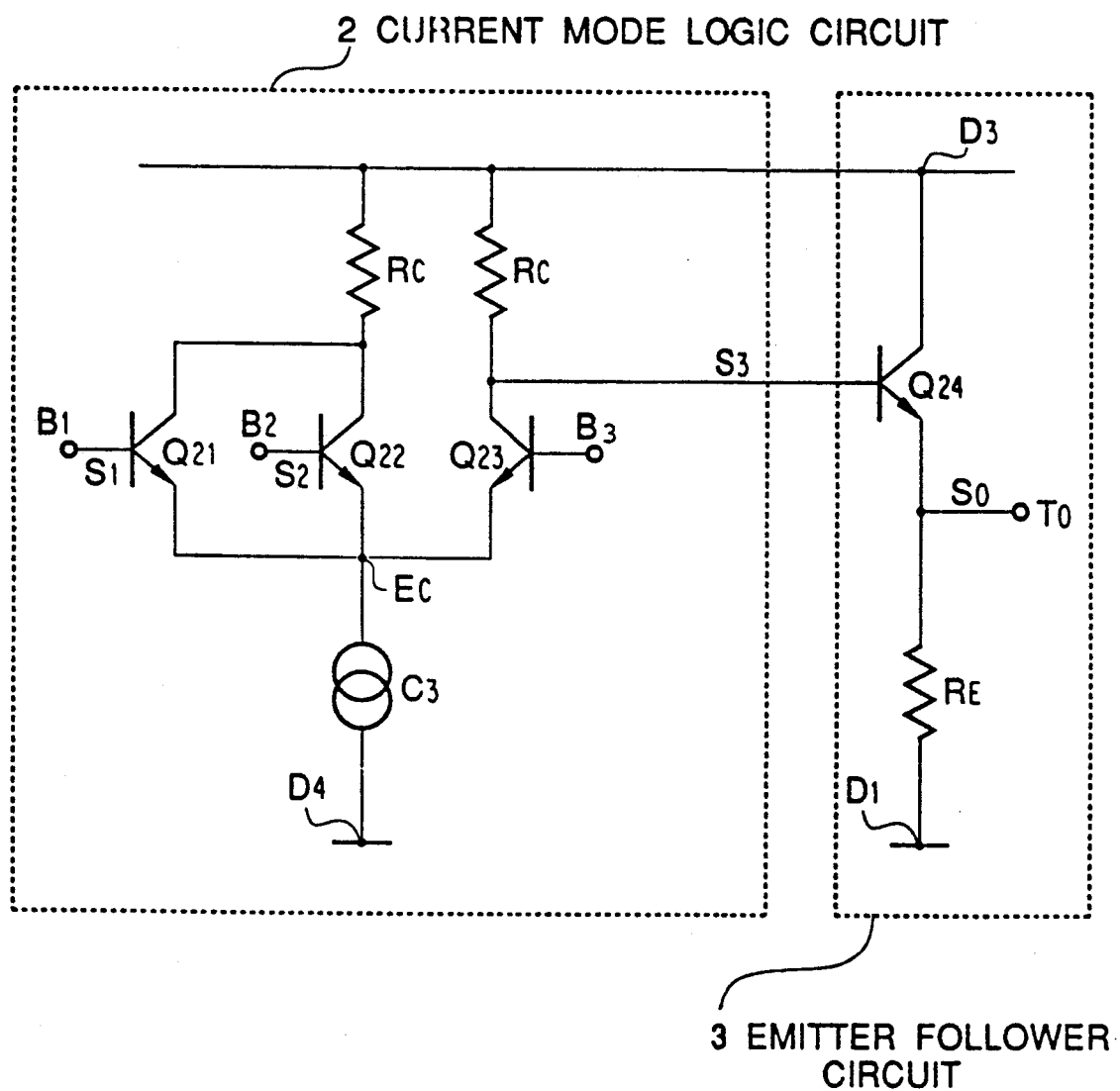
FIG. 1 is a circuit diagram of one typical example of a basic ECL logic circuit.

Referring to FIG. 1, there is shown a circuit diagram of one typical example of a basic ECL logic circuit. The shown ECL logic circuit includes a current mode logic circuit 2 and an emitter follower circuit 3 having an input connected to an output of the current mode logic circuit 2. The current mode logic circuit 2 includes three NPN transistors $Q_{21}$, $Q_{22}$ and $Q_{23}$ having emitters commonly connected to a node Ec, which is in turn connected through a constant current source $C_3$ to a low potential supply line $D_4$. Collectors of the NPN transistors $Q_{21}$ and $Q_{22}$ are commonly connected to each other and connected through a resistor Rc to a high potential supply line $D_3$. Bases $B_1$ and $B_2$ of the NPN transistors $Q_{21}$ and $Q_{22}$ receive input signals $S_1$ and $S_2$, respectively. On the other hand, A collector of the NPN transistor $Q_{23}$ is connected through another resistor Rc to the high potential supply line $D_3$. A base $B_3$ of the NPN transistor $Q_{23}$ is supplied with a reference voltage (not shown). An output signal $S_3$ is outputted from the collector of the NPN transistor $Q_{23}$.

The emitter follower circuit 3 includes an NPN transistor $Q_{24}$ having a base connected to the collector of the NPN transistor $Q_{23}$ and a collector connected to the high potential supply line $D_3$. An emitter of the NPN transistor $Q_{24}$ is connected through a resistor $R_E$ to a low voltage line $D_1$, and also connected to an output terminal To so as to output an output signal So.

In the above mentioned ECL logic circuit, a logical sum of the input signals $S_1$ and $S_2$ applied to the base terminals $B_1$ and $B_2$ is obtained from the output terminal To.

In the above mentioned ECL logic circuit, the emitter resistor $R_E$ functions as an emitter follower termination resistor. However, the emitter resistor $R_E$ can be replaced with a constant current source.

Figure 2:
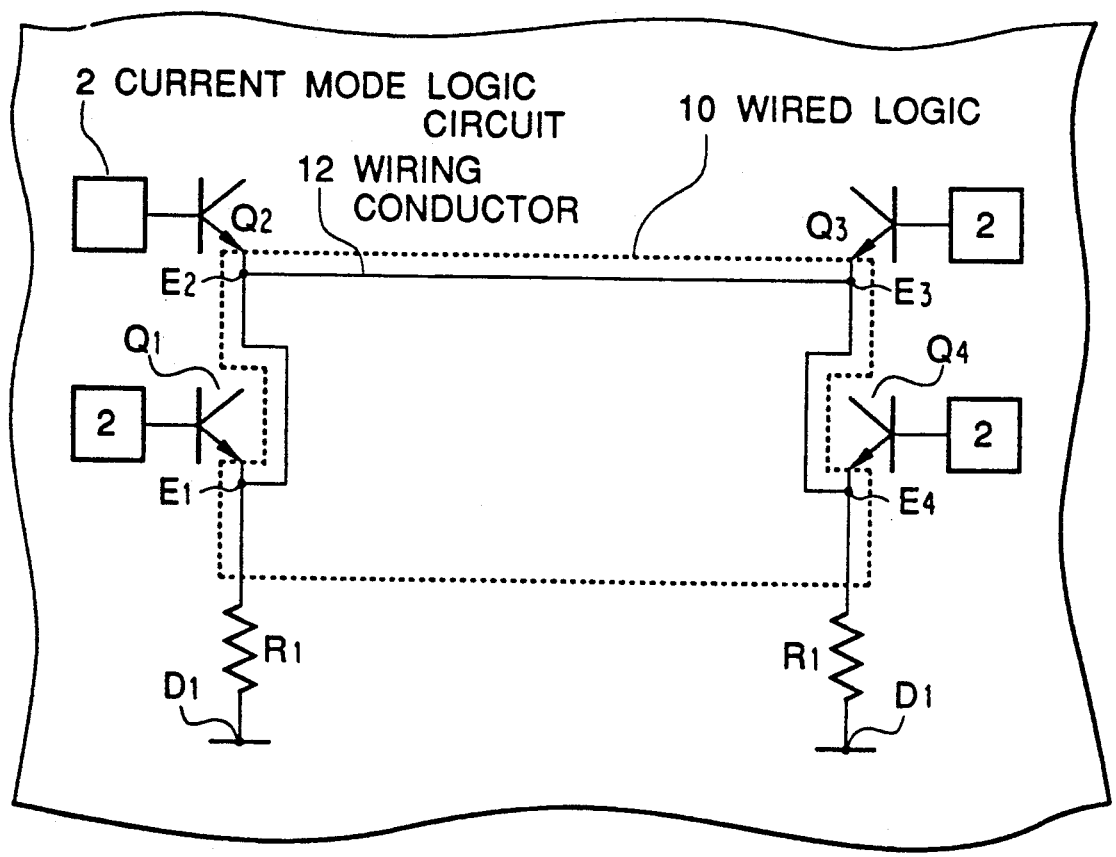
FIG. 2 is a connection diagram of one embodiment of the wired logic in accordance with the present invention.

Referring to FIG. 2, there is shown a connection diagram of one embodiment of the wired logic in accordance with the present invention.

The shown wired logic 10 is formed by interconnecting emitter follower output terminals $E_1$ to $E_4$ of four ECL logic circuits, each of which may be formed similarly to that shown in FIG. 1. Namely, each of the four current mode logic circuits 2 may be the same as that shown in FIG. 1.

A first ECL logic circuit includes a current mode logic circuits 2 and an NPN transistor $Q_1$ having a base connected to an output of the current mode logic circuits 2. This NPN transistor $Q_1$ constitutes an emitter follower circuit similar to that shown in FIG. 1, and has a collector connected to a high potential supply line (not shown). An emitter of the NPN transistor $Q_1$ is connected to an emitter follower output terminal $E_1$.

Similarly, second, third and fourth ECL logic circuits include NPN transistors $Q_2$, $Q_3$ and $Q_4$, respectively, whose base is connected to an output of a corresponding current mode logic circuits 2. Collectors of the NPN transistors $Q_2$, $Q_3$ and $Q_4$ are connected to the high potential supply line (not shown), respectively. Emitters of the NPN transistors $Q_2$, $Q_3$ and $Q_4$ are connected to emitter follower output terminals $E_2$, $E_3$ and $E_4$, respectively.

In order to realize a wired logic, a wiring conductor 12 for interconnecting the emitter follower output terminals $E_1$ to $E_4$ of the four ECL logic circuits starts from the emitter follower output terminal $E_1$ and serially extends and traces through the emitter follower output terminal $E_2$ and $E_3$ to the emitter follower output terminal $E_4$ in the named order and without branch. In other words, a starting end of the wiring conductor 12 is connected to the emitter follower output terminal $E_1$, and a terminating end of the wiring conductor 12 is connected to the emitter follower output terminal $E_4$. The emitter follower output terminal $E_2$ and $E_3$ are connected to an intermediate portion of the wiring conductor 12 in the named order.

In addition, a pair of termination resistors $R_1$ having the same resistance are connected to only the opposite ends of the wiring conductor 12, namely, only the emitter follower output terminals $E_1$ and $E_4$. Specifically, one of the termination resistors $R_1$ is connected between the emitter follower output terminal $E_1$ and the low voltage line $D_1$, and the other termination resistor $R_1$ is connected between the emitter follower output terminal $E_4$ and the low voltage line $D_1$.

Assuming that an emitter follower circuit current is 2 mA, a current flowing through the wiring conductor 12 interconnecting the emitter follower output terminals $E_1$ to $E_4$ is 1 mA at maximum, regardless of which of the transistors $Q_1$ to $Q_4$ is turned on (namely outputs a high level signal). This corresponds to a current density of $0.5 \times 10^5$ A/cm$^2$, assuming that the width and the thickness of the wiring conductor are 2 $\mu$m and 1 $\mu$m, respectively.

Here, consider the current density under the first and second prior art wired logics as explained hereinbefore. Assuming that an emitter follower circuit current is 2 mA, and the width and the thickness of the wiring conductor are 2 $\mu$m and 1 $\mu$m, respectively, the maximum current density is $0.75 \times 10^5$ A/cm$^2$ in the first prior art wired logic and $1 \times 10^5$ A/cm$^2$ in the second prior art wired logic. Therefore, it will be understood that the wired logic shown in FIG. 2 characterized in that the maximum current density of the wiring conductor constituting the wired logic is remarkably reduced in comparison with the first and second prior art wired logic as explained hereinbefore.

Furthermore, the reduced current flowing through the wiring conductor will also reduce the amount of a potential shift caused by the resistance of the wiring conductor itself.

Figure 3:
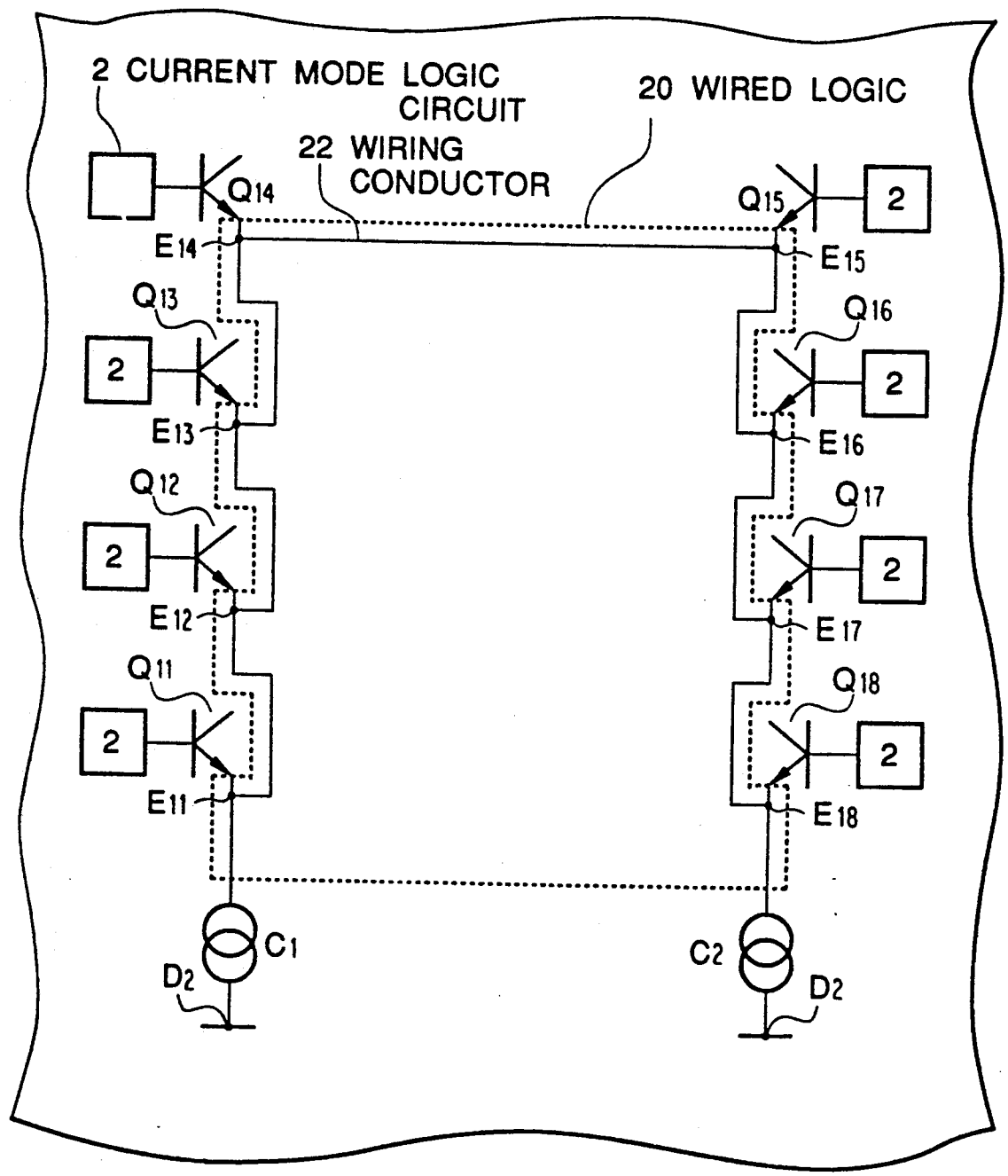
FIG. 3 is a connection diagram of another embodiment of the wired logic in accordance with the present invention.

Referring to FIG. 3, there is shown a connection diagram of another embodiment of the wired logic in accordance with the present invention.

The shown wired logic 20 is formed by interconnecting emitter follower output terminals $E_{11}$ to $E_{18}$ of eight ECL logic circuits, each of which may be formed similarly to that shown in FIG. 1.

A first ECL logic circuit includes a current mode logic circuits 2 and an NPN transistor $Q_{11}$ having a base connected to an output of the current mode logic circuits 2. This NPN transistor $Q_{11}$ constitutes an emitter follower circuit similar to that shown in FIG. 1, and has a collector connected to a high potential supply line (not shown). An emitter of the NPN transistor $Q_{11}$ is connected to the emitter follower output terminal $E_{11}$.

Similarly, second to eighth ECL logic circuits include NPN transistors $Q_{12}$ to $Q_{18}$, respectively, each of which has a base connected to an output of a corresponding current mode logic circuits 2. Collectors of the NPN transistors $Q_{12}$ to $Q_{18}$ are connected to the high potential supply line (not shown), respectively. Emitters of the NPN transistors $Q_{12}$ to $Q_{18}$ are connected to emitter follower output terminals $E_{12}$ to $E_{18}$, respectively.

In order to realize a wired logic, a wiring conductor 22 for interconnecting the emitter follower output terminals $E_{11}$ to $E_{18}$ of the eight ECL logic circuits starts from the emitter follower output terminal $E_{11}$ and serially extends and traces through the emitter follower output terminal $E_{12}$ to $E_{17}$ to the emitter follower output terminal $E_{18}$ in the named order without branch. In addition, a pair of constant current sources $C_1$ and $C_2$ having the same current capacity of 1 mA are respectively connected to only the opposite ends of the wiring conductor 22, namely, between only the emitter follower output terminals $E_{11}$ and $E_{18}$ and the low voltage line $D_1$.

In this embodiment, an emitter follower circuit current is 2 mA which is a total of the current capacities of the constant current sources $C_1$ and $C_2$. A current flowing through the wiring conductor 22 interconnecting the emitter follower output terminals $E_{11}$ to $E_{18}$ is 1 mA at maximum, regardless of which of the transistors $Q_{11}$ to $Q_{18}$ is turned on (namely outputs a high level signal). This also corresponds to a current density of $0.5 \times 10^5$ A/cm$^2$, assuming that the width and the thickness of the wiring conductor are 2 $\mu$m and 1 $\mu$m, respectively.

Here, consider a case in which the eight emitter follower output terminals $E_{11}$ to $E_{18}$ are interconnected in the connection pattern of a tree structure similar to the first prior art wired logic as explained hereinbefore, and each of the eight emitter follower output terminals $E_{11}$ to $E_{18}$ is connected with a constant current source of 0.25 mA. In this case, the maximum current density is $0.875 \times 10^5$ A/cm$^2$, assuming that an emitter follower circuit current is 2 mA, and the width and the thickness of the wiring conductor are 2 $\mu$m and 1 $\mu$m, respectively.

Also consider another case in which the eight emitter follower output terminals $E_{11}$ to $E_{18}$ are interconnected in the connection pattern of a tree structure, similarly to the first prior art wired logic as explained hereinbefore, but only one constant current source of 2 mA is connected to only one of the eight emitter follower output terminals $E_{11}$ to $E_{18}$, similarly to the second prior art wired logic as explained hereinbefore. In this case, the maximum current density is $1 \times 10^5$ A/cm$^2$ under the same condition.

Therefore, the wired logic shown in FIG. 3 is advantageous in that the maximum current density of the wiring conductor constituting the wired logic is remarkably reduced in comparison with the first and second prior art wired logics as explained hereinbefore. In addition, the reduced current flowing in the wiring conductor will also reduce the amount of a potential shift caused by the resistance of the wiring conductor itself.

As would be seen from the above, the larger the number of the emitter follower output terminals interconnected to form a wired logic becomes, the more the advantage of the wired logic in accordance with the present invention becomes remarkable.

As will be apparent from the above description of the embodiment with reference to the accompanying drawings, the wired logic in accordance with the present invention can reduce the current flowing through the wiring conductor constituting the wired logic to a half of an emitter follower current.

This means that, in the ECL gate arrays microminiaturized more and more, it is possible to design a wired logic having an emitter follower circuit current which is a double of a current permitted by a wiring conductor width (and thickness). Namely, the wiring conductor constituting the wired logic can flow a current which is a double of the maximum current permitted in the prior art in which a current source is connected to only one emitter follower output terminal. Accordingly, it is possible to reduce by half a time constant (capacitance × resistance) in the wired logic portion, and therefore, to construct a wired logic having a sufficient reliability and operating a speed higher than the conventional one.

The invention has thus been shown and described with reference to the specific embodiments. However, it should be noted that the present invention is in no way limited to the details of the illustrated structures but changes and modifications may be made within the scope of the appended claims.

I claim:

1. A gate array integrated circuit including a plurality of internal logic circuits each composed of a logic circuit and an emitter follower circuit having an input connected to an output of the logic circuit, and at least one wired logic circuit formed by interconnecting output terminals of N emitter follower circuits included in said plurality of internal logic circuits, where N is an integer greater than 2, wherein one end of an interconnection wiring conductor for interconnecting said output terminals of said N emitter follower circuits is connected to an output terminal of a first emitter follower circuit of said N emitter follower circuits, and the other end of said interconnection wiring conductor is connected to an output terminal of an Nth emitter follower circuit of said N emitter follower circuits, said interconnection wiring conductor extending from said output terminal of said first emitter follower circuit to said output terminal of said Nth emitter follower circuit to serially trace all said output terminals of said N emitter follower circuits without branch so that said output terminals of said N emitter follower circuits excluding said output terminals of said first and Nth emitter follower circuits are connected to an intermediate portion of said interconnection wiring conductor in the order, only said output terminals of said first and Nth emitter follower circuits being connected with load means having the same value, respectively.

2. A gate array integrated circuit claimed in claim 1 wherein both of said load means are composed of a pair of resistors having the same resistance.

3. A gate array integrated circuit claimed in claim 1 wherein both of said load means are composed of a pair of constant current sources having the same current capacity.

* * * * *

UNITED STATES PATENT AND TRADEMARK OFFICE
CERTIFICATE OF CORRECTION

PATENT NO. : 5,077,493

DATED : December 31, 1991

INVENTOR(S) : Hiroyuki Misawa

It is certified that error appears in the above-identified patent and that said Letters Patent is hereby corrected as shown below:

Col. 2, line 49, delete "Qa" and insert --Qb--.

Signed and Sealed this

Twentieth Day of April, 1993

Attest:

MICHAEL K. KIRK

Attesting Officer

Acting Commissioner of Patents and Trademarks